(12) United States Patent
Kolsrud

(10) Patent No.: US 6,867,659 B2
(45) Date of Patent: Mar. 15, 2005

(54) METHOD AND APPARATUS FOR FILTERING A CLOCK SIGNAL

(75) Inventor: Arild T. Kolsrud, Malabar, FL (US)

(73) Assignee: Lucent Technologies Inc., Murray Hill, NJ (US)

(*) Notice: Subject to any disclaimer, the term of this patent is extended or adjusted under 35 U.S.C. 154(b) by 24 days.

(21) Appl. No.: 10/420,636

(22) Filed: Apr. 22, 2003

(65) Prior Publication Data

US 2004/0212448 A1 Oct. 28, 2004

(51) Int. Cl.[7] .................................................. H03K 3/00
(52) U.S. Cl. ........................ 333/20; 333/187; 327/165; 307/106
(58) Field of Search ........................ 333/20, 187, 193; 327/165, 168, 170, 172, 177, 178; 307/106, 107

(56) References Cited

U.S. PATENT DOCUMENTS

| | | | | |
|---|---|---|---|---|
| 3,824,334 A | * | 7/1974 | Jacobson et al. .......... 358/439 |
| 4,518,936 A | * | 5/1985 | Sutphin, Jr. ................. 333/173 |
| 5,696,491 A | * | 12/1997 | White et al. ................ 340/657 |
| 5,734,285 A | * | 3/1998 | Harvey ....................... 327/291 |
| 6,356,129 B1 | * | 3/2002 | O'Brien et al. ............ 327/175 |
| 6,654,467 B1 | * | 11/2003 | York et al. ............... 381/71.14 |

FOREIGN PATENT DOCUMENTS

WO    WO 98/59294    * 12/1998

* cited by examiner

Primary Examiner—Barbara Summons

(57) ABSTRACT

A method and an apparatus are provided for filtering a substantially square wave signal. At least a portion of the substantially square wave signal is applied to a first filter adapted to pass a range of frequencies adjacent the fundamental frequency and produce a first filtered signal. At least a portion of the substantially square wave signal is also applied to a plurality of second filters, where each of the second plurality of filters is adapted to pass a range of frequencies adjacent an odd harmonic component of the fundamental frequency and produce a second filtered signal. The first signal and the plurality of second filtered signals are combined to produce a representation of a square wave signal having a frequency substantially corresponding to the fundamental frequency.

30 Claims, 5 Drawing Sheets

FIGURE 7

METHOD AND APPARATUS FOR FILTERING A CLOCK SIGNAL

BACKGROUND OF THE INVENTION

1. Field of the Invention

This invention relates generally to a method and apparatus for conditioning a clock signal, and, more particularly, to a method and apparatus for filtering a clock signal to reduce both broad and narrowband noise.

2. Description of the Related Art

Over time, electronic devices have evolved from relatively simple units to more complex devices. A typical modern electronic device is constructed of numerous subassemblies, each performing its own separate task, but collectively interoperating to control the overall operation of the device. For example, a modern electronic device may include a processor subassembly and a memory subassembly. During the operation of the electronic device, the subassemblies must be able to communicate with one another to exchange information or data. To achieve this communication or interoperation, the functioning of the various subassemblies must be carefully coordinated. For example, the processor subassembly must know precisely when the memory subassembly is providing requested information. Typically, this coordination of the subassemblies is accomplished by synchronizing the operation of the subassemblies through a reference or clock signal.

Typically, a clock signal oscillates at a preselected frequency and the subassemblies are constructed to time their various operations relative to a transition in the clock signal. That is, the operation of each subassembly is configured to perform its functions in synchronism with a common transition or clock edge of the clock signal. Accordingly, proper operation of modern electronic devices is critically dependent upon highly accurate clock signals. Even minor variations in the timing of these clock edges can reduce the performance of the device or even cause its operation to fail. Electronic disturbances, such as noise, on the clock signal can cause mistimed or faulty operation of the subassemblies, or at least problems with interoperability.

Thus, analog clock signals are commonly filtered to remove spurious transitions caused by noise. Filtering, however, can reduce the precision of a clock signal; particularly where the clock signal is a digital square wave, such as is stylistically represented by the waveform of FIG. 1A. For example, applying a relatively narrow bandpass or notch filter to a square wave clock signal distorts the square wave clock signal by rounding off edges and extending the time period for the transition, as shown in FIG. 1B. This distortion can affect the timing of the clock edges, and thus, interoperability of the subassemblies may be compromised.

The present invention is directed to overcoming, or at least reducing, one or more of the problems set forth above.

SUMMARY OF THE INVENTION

In one aspect of the present invention, a method is provided for filtering a signal having a fundamental frequency. At least a portion of the signal is filtered to pass a range of frequencies adjacent the fundamental frequency and produce a first filtered signal. At least a portion of the signal is filtered to pass a range of frequencies adjacent an odd harmonic component of the fundamental frequency and produce a second filtered signal. The first and second filtered signals are then combined.

In another aspect of the present invention, a method for filtering a signal having a fundamental frequency is provided. The signal is received and frequencies outside of a first narrow range of frequencies encompassing the fundamental frequency are substantially attenuated. Frequencies outside of a second narrow range of frequencies encompassing an odd harmonic component of the fundamental frequency are also substantially attenuated.

In yet another aspect of the present invention, a filter is provided. The filter is comprised of a first and second component. The first component is coupled to a source of a signal having a fundamental frequency, and is adapted to substantially attenuate frequencies outside of a first narrow range of frequencies encompassing the fundamental frequency. The second component is coupled to the source of the signal, and is adapted to substantially attenuate frequencies outside of a second narrow range of frequencies encompassing an odd harmonic component of the fundamental frequency.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 1A:
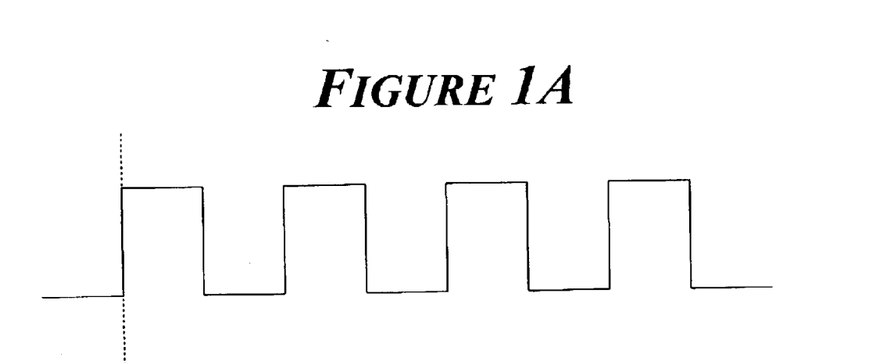
FIGS. 1A–B illustrate various waveforms of a conventional clock signal.
Figure 1B:
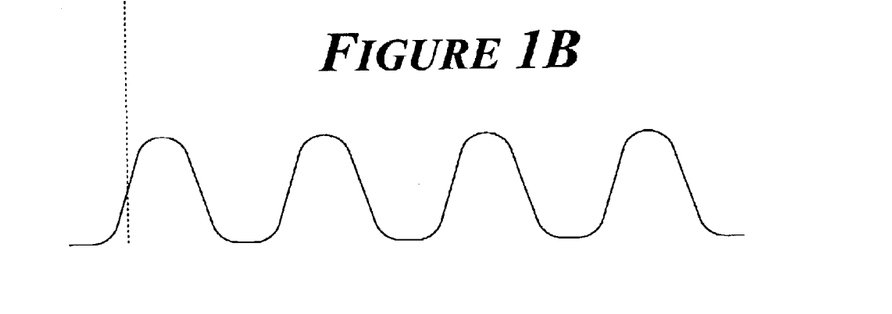

Typically, a clock signal in a digital system takes the form of a substantially square wave (SQ), such as is idyllically represented in FIG. 1A. Such a square wave may be represented by the following Fourier transform:

$$F(S_{SQ}) = A \cdot \sin(2\pi \cdot f_{sw} + \phi) + A/3 \cdot \sin(2\pi \cdot 3 f_{sw} + \phi) + A/5 \cdot \sin(2\pi \cdot 5 f_{sw} + \phi) + \ldots \quad (1)$$

As can be seen from the Fourier transform, the square wave signal is comprised of a fundamental frequency ($f_{sw}$) plus the odd harmonic frequencies ($3 f_{sw}$, $5 f_{sw}$, $7 f_{sw}$, $9 f_{sw}$ ...). Therefore, applying a relatively narrowband filter to the square wave signal to reduce spurious noise will also substantially reduce the odd harmonic components of the square wave signal, leaving a signal that more closely approximates a sinusoidal signal, rather than a square wave signal (see FIG. 1B). The resulting sinusoidal signal may not be a suitable reference for generating highly precise timing from the clock signal edges/transitions. A broadband filter may be advantageously employed to allow at least the lowest order harmonic components to pass along with the fundamental frequency. In some instances, this approach may produce a reasonable approximation of a square wave. However, the broadband filter allows undesirable noise in the frequency range falling between the fundamental and odd harmonic frequencies to pass therethrough. Thus, in at least some cases, the broadband filter may be unacceptably sensitive to this unfiltered noise.

Figure 2:
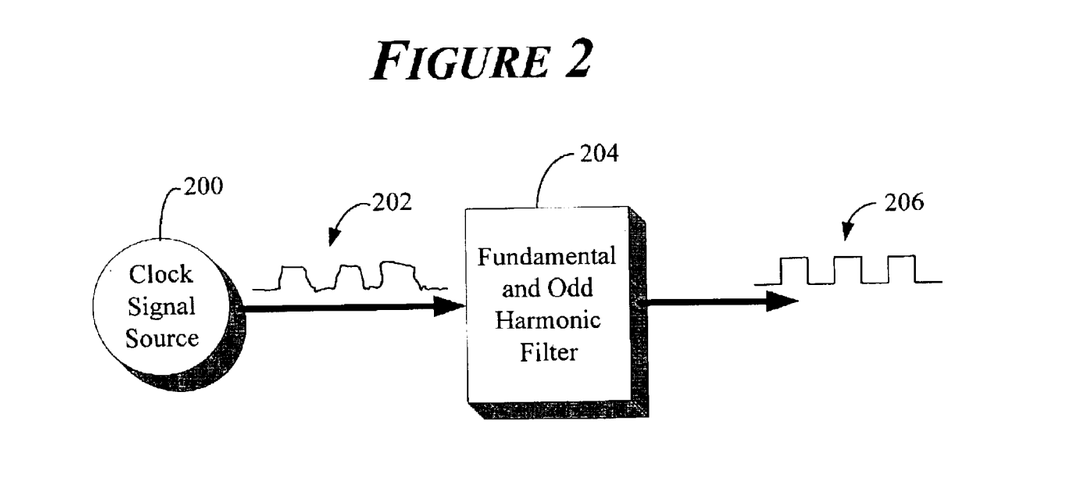
FIG. 2 illustrates a top level block diagram of one embodiment of a system in which a filtered clock signal may have application.

The instant invention advantageously employs aspects of narrowband filtering to produce an accurate representation of a square wave signal that is relatively insensitive to both narrowband and broadband noise. Turning now to FIG. 2, a clock signal source 200 produces a substantially square wave clock signal having a fundamental frequency of $f_{sw}$. The clock signal, stylistically represented by element number 202, may have, at least temporarily, noise of various frequencies and magnitudes impressed thereon such that the clock signal 202 is unusable for highly precise timing operations. Those skilled in the art will appreciate that noise on a clock signal may be interpreted as a "false" edge or transition of the clock signal, which may cause a subassembly, for example, to provide or read data at an inappropriate time.

A filter 204 employing aspects of the instant invention is coupled to the clock source 200 and receives the relatively noisy clock signal 202 therefrom. The filter 204 is configured to selectively pass a plurality of narrow ranges of frequencies that include the fundamental frequency as well as at least some of the odd harmonic components of the fundamental frequency. In this manner signals in frequency ranges outside the fundamental and odd harmonic frequencies are removed. As these signals do not make up a portion of the square wave signal, as indicated by the Fourier transform (1)), they are presumptively noise, and not part of the square wave clock signal. Thus, the filter 204 is capable of producing a substantially square wave clock signal 206 that is highly accurate and has a substantially reduced level of noise, both broadband and narrowband noise.

Figure 3:
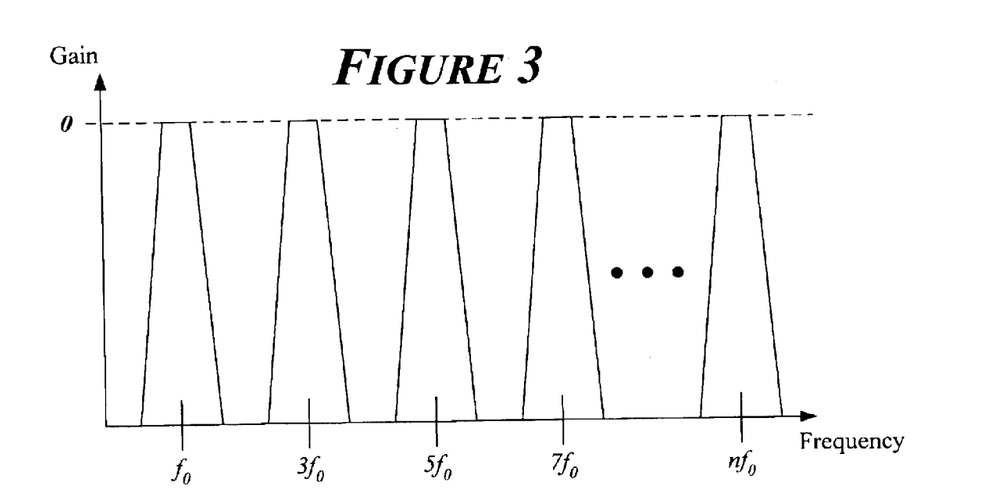
FIG. 3 illustrates a graphic representation of a filter function that may be employed in a filter that may be used in the system of FIG. 2.

An exemplary graph of a typical frequency response for a filter of the type shown in FIG. 2 is presented in FIG. 3. As can be seen from the graph, which charts frequency ($f$) versus gain (dB), the frequency response is high in relatively narrow regions surrounding the fundamental frequency ($f_0$) and each of the odd harmonic frequencies ($3 f_0$, $5 f_0$, $7 f_0$ ... $n f_0$), and low elsewhere. Thus, signals having a frequency near the fundamental and odd harmonic frequencies are passed without substantial attenuation. Signals having a frequency substantially removed from the fundamental and odd harmonic frequencies are substantially attenuated. For example, a signal having a frequency of about $2 f_0$ is substantially blocked by a filter having the frequency response illustrated in FIG. 3. Since the frequency of $2 f_0$ does not form a part of a square wave signal having a frequency of $f_0$, it is presumptively noise, and its removal is beneficial.

Figure 4:
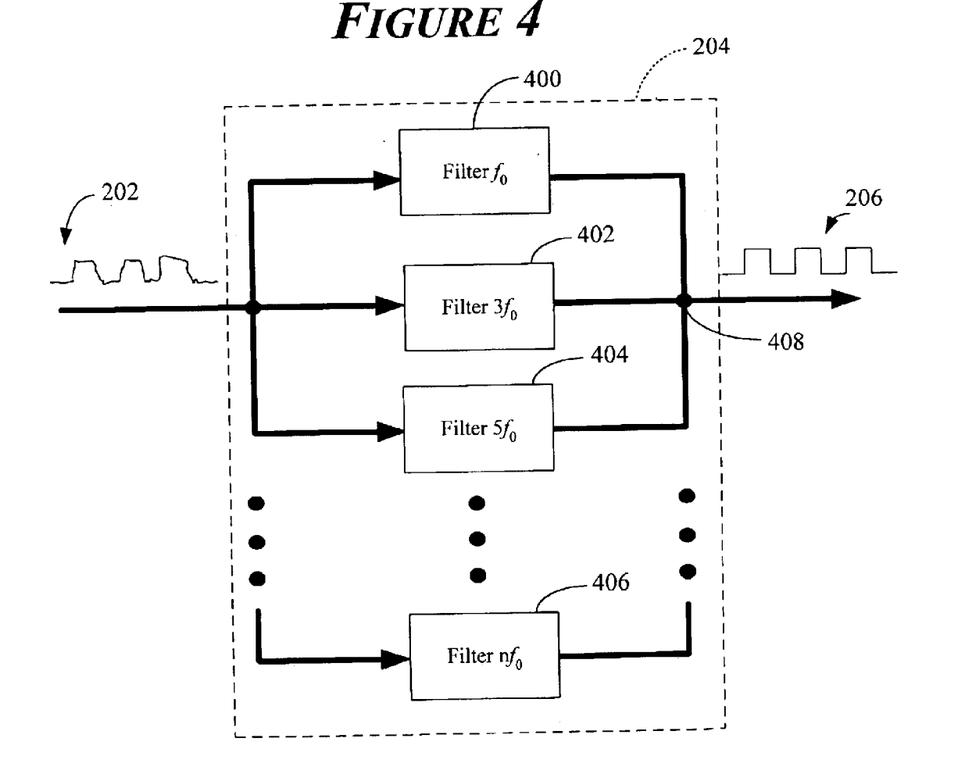
FIG. 4 illustrates a block diagram of one embodiment of a filter that may be used in the system of FIG. 2.

Turning now to FIG. 4, a block level diagram of an exemplary embodiment of the filter 204 of FIG. 2 is illustrated. In the illustrated embodiment, the filter 204 is comprised of a plurality of filters 400, 402, 404, 406. The filters 400, 402, 404, 406 may be constructed as bandpass and coupled in parallel such that each of the filters 400, 402, 404, 406 receives the unfiltered clock signal 202, applies its filtering strategy to the clock signal 202, and then passes the now filtered signal to a common connection 408. Alternatively, the filters 400, 402, 404, 406 may be constructed as notch filters and coupled in series. The signal components provided by each of the filters 400, 402, 404, 406 are combined via the common connection 408 to produce the substantially square wave signal 206. Each of the bandpass filters 400, 402, 404, 406 is designed to pass a range of frequencies encompassing the frequency associated therewith. For example, the bandpass filter 400 is designed to pass a narrow range of frequencies encompassing the fundamental frequency $f_0$. In some embodiments, it may be useful to have the bandpass filter 400 configured to pass a narrow range of frequencies centered about the fundamental frequency $f_0$, and in other embodiments, the frequency range of the bandpass filter 400 may be asymmetrically positioned about the fundamental frequency $f_0$.

The bandpass filters 402, 404, 406 are similarly configured to pass frequencies adjacent the odd harmonic component associated therewith. For example, the bandpass filter 402 passes a narrow range of frequencies associated with the $3^{rd}$ harmonic component ($3 f_0$) of the fundamental frequency ($f_0$). Similarly, the bandpass filter 404 passes a narrow range of frequencies associated with the $5^{th}$ harmonic component ($5 f_0$) of the fundamental frequency ($f_0$), and so forth. The final bandpass filter 406 passes a narrow range of frequencies associated with the $n^{th}$ harmonic component ($n f_0$) of the fundamental frequency ($f_0$). It will be appreciated that the number of bandpass filters, and thus, the number of harmonic components used to form the clock signal 206 is a design consideration dependent on many factors of the system in which the clock signal is intended to be used. In any event, those skilled in the art will recognize that generally, all other things being equal, as more harmonic components are used, the resulting clock signal 206 may more closely approximate the idealized square wave clock signal of FIG. 1A.

Figure 5A:
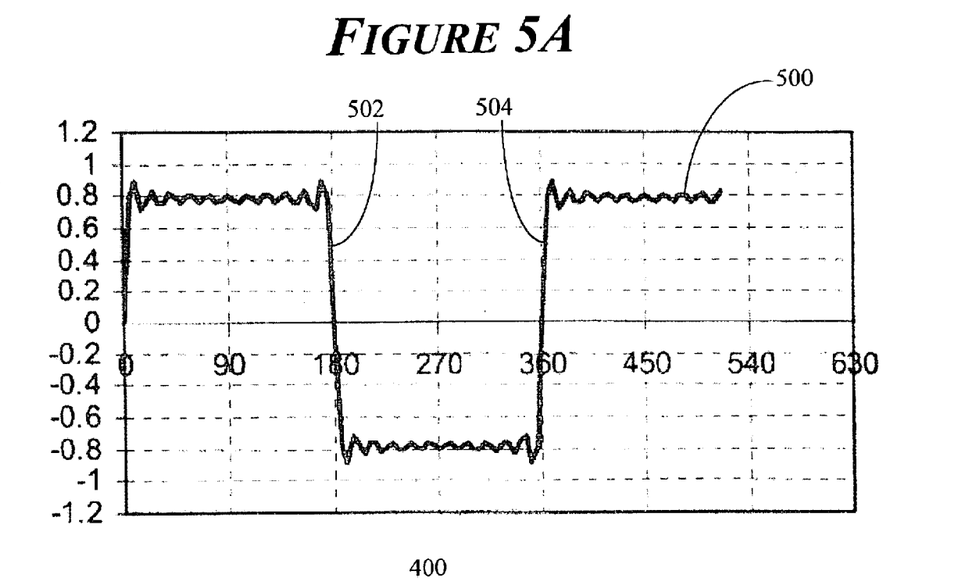
FIGS. 5A–B illustrate waveforms representative of a filtered square wave clock signal resulting from various embodiments of the filter of FIGS. 2 and 4.
Figure 5B:
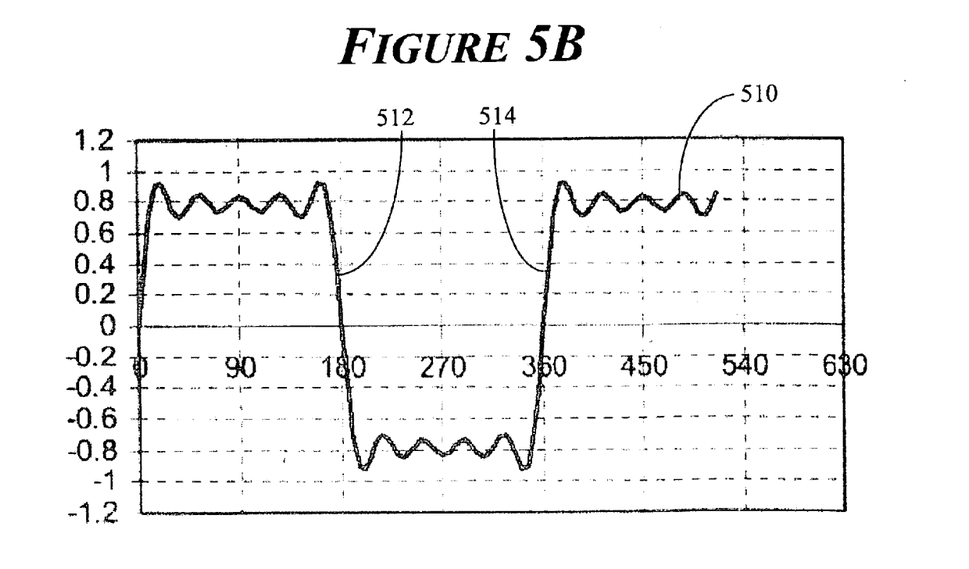

FIGS. 5A–5B illustrate square wave signals that have been produced using varying numbers of filters. For example, a clock signal 500 illustrated in FIG. 5A was constructed using eleven bandpass filters to produce the fundamental frequency ($f_0$) and ten odd harmonic frequency components ($3 f_0$, $5 f_0$, $7 f_0$, $9 f_0$, $11 f_0$, $13 f_0$, $15 f_0$, $17 f_0$, $19 f_0$, and $21 f_0$). As can be seen in the drawing, the resulting clock signal closely approximates the idealized square wave, especially in that the clock edges 502, 504 are substantially vertical.

In an alternative embodiment, a clock signal 510 illustrated in FIG. 5B was constructed using five bandpass filters to produce the fundamental frequency ($f_0$) and four odd harmonic frequency components ($3 f_0$, $5 f_0$, $7 f_0$ and $9 f_0$). As can be seen in the drawing, the resulting clock signal still approximates a square wave, though less closely than the clock signal of FIG. 5A. The clock signal 510 differs from the idealized square wave most significantly in the edge regions 512, 514. However, depending on the implementation, the clock signal 510 may have sufficient accuracy to permit proper operation of the system in which it is intended to be used. Accordingly, a designer may advantageously use the principals of the instant invention to design a filter that provides the accuracy required for a particular application by varying the number of odd harmonic components used to assemble the clock signal.

Figure 6:
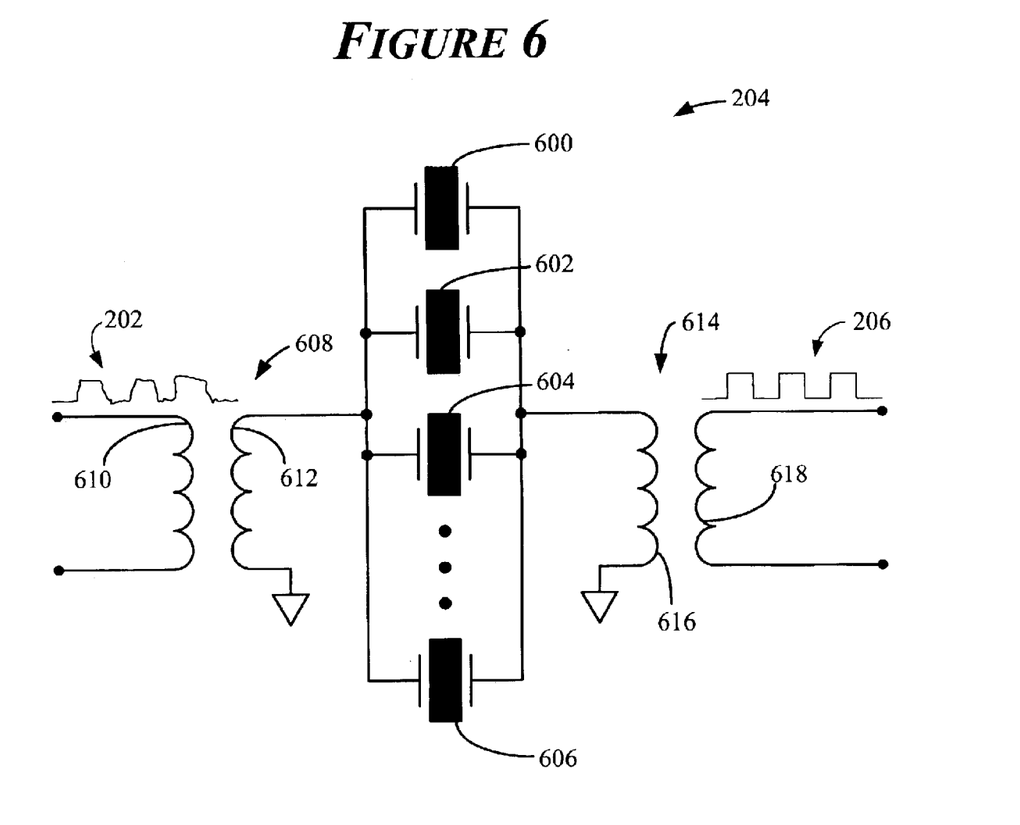
FIG. 6 illustrates an electrical schematic of one implementation of the filter of FIGS. 2 and 3.

Turning now to FIG. 6, one implementation of an embodiment of the filter 204 of FIGS. 2 and 4 is illustrated. In the specific implementation illustrated in FIG. 6, a plurality of crystals 600, 602, 604 and 606 are coupled in parallel, such that all of the crystals 600–606 receive an excitation signal through an input transformer 608. The input transformer has a primary winding 610 and a secondary winding 612. The primary winding 610 is coupled to receive a generally unfiltered clock signal represented by the element number 202. The secondary winding 612 is coupled to a first terminal of each of the crystals 600, 602, 604, 606. Thus, the unfiltered clock signal 202 is inductively coupled from the primary winding 610 to the secondary winding 612 and then to each of the crystals 600, 602, 604, 606.

The crystals 600, 602, 604 and 606 are also coupled in parallel to collectively deliver a filtered clock signal represented by the element number 206 through an output transformer 614. The output transformer 614 has a primary winding 618 and a secondary winding 616. The secondary winding 616 is coupled to a second terminal of each of the crystals 600, 602,604, 606. The primary winding 618 is coupled to external circuitry (not shown). Thus, the filtered clock signal 206 is inductively coupled from the secondary winding 616 to the primary winding 616 and then to the external circuitry (not shown).

The input and output transformers 608, 614 perform the useful function of impedance matching. Those skilled in the art will appreciate that circuitry other than transformers may used to perform the desired impedance matching without departing from the spirit and scope of the instant invention. In one embodiment, the turns ratios of both the input and output transformers 608, 614 are defined by the equation:

$$N^2 = Z_0/Z_1$$

where $Z_0$ is the impedance of the source circuitry (not shown) used to provide the unfiltered clock signal and $Z_1$ is the collective input impedance of the crystals 600, 602, 604 and 606, as shown in FIG. 6. Thus, it should be appreciated that the impedance $Z_1$ corresponds to the combination of the individual crystal impedance $Z_2$, as defined by the equation:

$$Z_1 = (2Z_2)/(m+1)$$

where m is the number of the highest order harmonic signal passed by the filter, assuming each crystal/filter element has equal impedance.

Generally, crystals can be biased to oscillate at a preselected resonant frequency under two basic scenarios. In a first situation, a crystal can be made to oscillate by applying a relatively large D.C. voltage thereto. Thus, in some applications, a clock source signal is produced by applying $V_{cc}$ directly to the crystal. In a second situation, a crystal can be made to oscillate by applying a relatively low power signal that is oscillating at the resonant frequency. The second situation will occur only if the excitation signal is very close to the resonant frequency of the crystal (e.g., within 0.5% of the resonant frequency). The instant invention advantageously employs the principles of the second situation to produce high quality narrow band filters.

The crystal 600 is selected to have a resonant frequency $f_0$. Thus, when the unfiltered clock signal 202 is also of this same basic frequency, the crystal 600 will begin oscillating at the resonant frequency $f_0$. Similarly, each of the remaining crystals 602, 604 and 606 is selected to have a resonant frequency of $3f_0$, $5f_0$, and $N f_0$, respectively. Thus, since the unfiltered clock signal 202 is a square wave generally, and thus possesses each of the odd harmonic components of the fundamental frequency, then each of the crystals 602, 604 and 606 will also begin to oscillate at its respective resonant frequencies. Thus, as is suggested by equation 1 above, the output signals from the crystals 600, 602, 604 and 606 may be combined to form a representation of a square wave. Moreover, since the crystals 600, 602, 604 and 606 can be forced to oscillate by a signal in a very narrow band surrounding its resonant frequency, noise in other frequency spectrums is ignored or filtered to produce a relatively noise free square wave at the fundamental frequency $f_0$.

Figure 7:
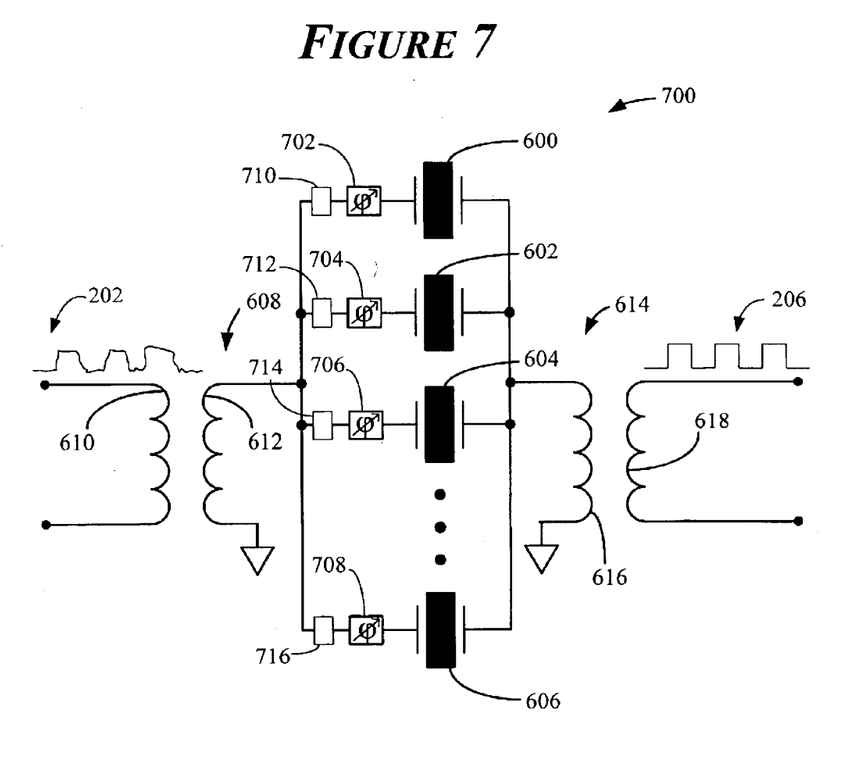
FIG. 7 illustrates an electrical schematic of an alternative implementation of the filter of FIGS. 2 and 4.

The instant invention has exhibited substantial tolerance to variations in phase and amplitude between the fundamental frequency signal and its odd harmonic components. In some applications, however, it may be useful to more closely control the phase differential. Turning now to FIG. 7, an alternative embodiment 700 of the filter 204 of FIGS. 2 and 4, including a mechanism for altering phase relationships between the fundamental frequency signal and its odd harmonics, is illustrated.

The filter 700 illustrated in FIG. 7 differs from the embodiment of the filter 204 illustrated in FIG. 6 primarily by the addition of conventional delay elements 702, 704, 706 and 708 associated with each of the crystals 600, 602, 604 and 606, respectively. While the embodiment illustrated herein shows the delay elements 702, 704, 706 and 708 positioned between the input transformer 608 and the crystals 600, 602, 604 and 606, respectively, those skilled in the art will appreciate that the delay elements 702, 704, 706 and 708 could also be located between the output transformer 614 and the crystals 600, 602, 604 and 606, respectively.

Generally, the function of the delay elements 702, 704, 706 and 708 is to align the signals delivered from its associated crystal 600, 602, 604 and 606. By controlling the magnitude of the delay inserted by the delay elements 702, 704, 706 and 708, the phase of each of the signals from each of the crystals 600, 602, 604 and 606 may be brought into substantial alignment. Those skilled in the art will appreciate that precise synchronization of the signals delivered by the crystals 600, 602, 604 and 606 is not necessary for proper operation of the filter 204. Rather, depending upon the application into which the filter 204 is being designed, a substantial misalignment of the phases may be tolerated. For example, phase differences of as much as ±10° have produced acceptable square wave signals.

Further, it should be appreciated that while the delay elements 702, 704, 706 and 708 have been shown associated with each and every crystal 600, 602, 604 and 606, such an arrangement is not necessary. In some applications, it may be useful to include delay elements for only a portion of the crystals. For example, assuming that the signals from the odd harmonic crystals 602, 604 and 606 are to be brought into substantial alignment with the signal from the fundamental crystal 600, the delay element 702 associated with the fundamental crystal 600 may be eliminated, or at least adjusted to substantially zero delay. This arrangement permits for retardation of the signals associated with the odd harmonic crystals 602, 604 and 606, as necessary to more closely align the phases of these odd harmonic signals with the unaltered phase of the fundamental frequency signal.

Additionally, in some applications, it may prove sufficient to provide only the delay element 704 associated with the lowest-order odd harmonic signal. Since the lowest-order odd harmonic signal has the most significant impact on reshaping the fundamental frequency signal to a square wave, the phase relationship of these two signals may be viewed as the most significant. Substantial misalignment between the fundamental frequency signal and the higher-order odd harmonics may be better tolerated, thereby reducing the need for phase adjustments to these signals.

In some embodiments it may be useful to also employ amplitude adjustment. The effect of adjusting the amplitude of the fundamental frequency and odd harmonics is, however, less significant than phase alignment, and thus, may not be needed in some embodiments of the invention. Generally, the amplitude of each of the signals is controlled according to the following equation:

$$|1/n|$$

Accordingly, a conventional device 710, 712, 714, and 716 for adjusting the gain applied to each of the signals is coupled to receive the unfiltered clock signal and pass the amplitude adjusted signal to its corresponding delay element 702, 704, 706 and 708. The location of the gain adjusting devices 710, 712, 714, and 716 relative to their corresponding delay elements 702, 704, 706 and 708 and crystals 600, 602, 604 and 606 may be varied. That is, the gain adjusting device 710, 712, 714, and 716 may be disposed between the delay element 702, 704, 706 and 708 and the crystal 600, 602, 604 and 606, or even after the crystal 600, 602, 604 and 606.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

I claim:

1. A method for filtering a signal having a fundamental frequency, comprising:
    filtering at least a portion of the signal to pass a range of frequencies adjacent the fundamental frequency to produce a first filtered signal;
    filtering at least a portion of the signal to pass a range of frequencies adjacent an odd harmonic component of the fundamental frequency to produce a second filtered signal; and
    combining the first and second filtered signals to form a periodic signal.

2. A method, as set forth in claim 1, further comprising filtering at least a portion of the signal to pass a range of frequencies adjacent another odd harmonic component of the fundamental frequency and produce a third filtered signal, and wherein combining the first and second filtered signals further comprises combining the first, second and third filtered signals.

3. A method, as set forth in claim 1, wherein combining the first and second filtered signals to form the periodic signal comprises combining the first and second filtered signals to form a at least one of a clock signal and a square wave signal.

4. A method, as set forth in claim 1, further comprising modifying one of the first and second filtered signals to alter a phase relationship therebetween.

5. A method, as set forth in claim 4, wherein modifying one of the first and second filtered signals to alter the phase relationship therebetween further comprises modifying one of the first and second filtered signals to reduce a phase differential therebetween.

6. A method, as set forth in claim 4, wherein modifying one of the first and second filtered signals to alter the phase relationship therebetween further comprises modifying one of the first and second filtered signals to substantially synchronize the first and second filtered signals.

7. A method, as set forth in claim 1, further comprising reducing a phase differential between the first and second filtered signals.

8. A method, as set forth in claim 1, further comprising substantially synchronizing the first and second filtered signals.

9. A method, as set forth in claim 1, wherein filtering at least a portion of the signal to produce the second filtered signal further comprises modifying at least the portion of the signal used to produce the second filtered signal to reduce a phase difference between the first and second filtered signals.

10. A method, as set forth in claim 1, wherein filtering at least a portion of the signal to produce the first filtered signal further comprises modifying at least the portion of the signal used to produce the first filtered signal to reduce a phase difference between the first and second filtered signals.

11. A method, as set forth in claim 1, wherein filtering at least a portion of the signal to produce the second filtered signal further comprises modifying at least the portion of the signal used to produce the second filtered signal to alter a phase relationship between the first and second filtered signals.

12. A method for filtering a signal having a fundamental frequency, comprising:
    filtering at least a portion of the signal to pass a range of frequencies adjacent the fundamental frequency to produce a first filtered signal;
    filtering at least a portion of the signal to pass a range of frequencies adjacent an odd harmonic component of the fundamental frequency to produce a second filtered signal; and
    combining the first and second filtered signals, wherein filtering at least a portion of the signal to produce the first filtered signal further comprises applying at least a portion of the signal to a crystal having a resonant frequency approximately corresponding to the fundamental frequency.

13. A method for filtering a signal having a fundamental frequency, comprising:
    filtering at least a portion of the signal to pass a range of frequencies adjacent the fundamental frequency to produce a first filtered signal;
    filtering at least a portion of the signal to pass a range of frequencies adjacent an odd harmonic component of the fundamental frequency to produce a second filtered signal; and
    combining the first and second filtered signals, wherein filtering at least a portion of the signal to produce the second filtered signal further comprises applying at least a portion of the signal to a crystal having a resonant frequency approximately corresponding to the odd harmonic component of the fundamental frequency.

14. A method for filtering a signal having a fundamental frequency, comprising:
    filtering at least a portion of the signal to pass a range of frequencies adjacent the fundamental frequency to produce a first filtered signal;
    filtering at least a portion of the signal to pass a range of frequencies adjacent an odd harmonic component of the fundamental frequency to produce a second filtered signal; and
    combining the first and second filtered signals, wherein the signal is a clock signal, filtering at least a portion of the signal to pass a range of frequencies adjacent the fundamental frequency further comprises filtering at least a portion of the clock signal to pass a range of frequencies adjacent the fundamental frequency, and filtering at least a portion of the signal to pass a range of frequencies adjacent the odd harmonic of the fundamental frequency further comprises filtering at least a portion of the clock signal to pass a range of frequencies adjacent the odd harmonic of the fundamental frequency.

15. A method for filtering a signal having a fundamental frequency, comprising:

filtering at least a portion of the signal to pass a range of frequencies adjacent the fundamental frequency to produce a first filtered signal;

filtering at least a portion of the signal to pass a range of frequencies adjacent an odd harmonic component of the fundamental frequency to produce a second filtered signal; and combining the first and second filtered signals, wherein the signal is a substantially square wave signal, filtering at least a portion of the signal to pass a range of frequencies adjacent the fundamental frequency further comprises filtering at least a portion of the substantially square wave signal to pass a range of frequencies adjacent the fundamental frequency, and filtering at least a portion of the signal to pass a range of frequencies adjacent the odd harmonic of the fundamental frequency further comprises filtering at least a portion of the substantially square wave signal to pass a range of frequencies adjacent the odd harmonic of the fundamental frequency.

16. A method for filtering a signal having a fundamental frequency, comprising:

receiving the signal; and filtering at least a portion of the signal to pass a first range of frequencies adjacent the fundamental frequency and a second range of frequencies adjacent an odd harmonic component of the fundamental frequency to form a periodic signal.

17. A method, as set forth in claim 16, wherein filtering at least a portion of the signal comprises applying at least a portion of the signal to a filter adapted to pass the first range of frequencies adjacent the fundamental frequency and a second plurality of ranges of frequencies adjacent a plurality of odd harmonic components of the fundamental frequency.

18. A method for filtering a signal having a fundamental frequency, comprising:

receiving the signal; and substantially attenuating frequencies outside of a first narrow range of frequencies encompassing the fundamental frequency, and frequencies outside of a second narrow range of frequencies encompassing an odd harmonic component of the fundamental frequency to form a periodic signal.

19. A method, as set forth in claim 18, wherein substantially attenuating frequencies further comprises substantially attenuating frequencies outside of a first narrow range of frequencies encompassing the fundamental frequency, and frequencies outside of a plurality of second narrow ranges of frequencies encompassing a plurality of odd harmonic components of the fundamental frequency.

20. An apparatus for filtering a signal having a fundamental frequency, comprising:

means for filtering at least a portion of the signal to pass a range of frequencies adjacent the fundamental frequency and produce a first filtered signal;

means for filtering at least a portion of the signal to pass a range of frequencies adjacent an odd harmonic component of the fundamental frequency and produce a second filtered signal; and means for combining the first and second filtered signals to form a periodic signal.

21. An apparatus for filtering a signal having a fundamental frequency, comprising:

means for receiving the signal; and means for substantially attenuating frequencies outside of a first narrow range of frequencies encompassing the fundamental frequency, and frequencies outside of a second narrow range of frequencies encompassing an odd harmonic component of the fundamental frequency to form a periodic signal.

22. A filter, comprising:

a first component coupled to a source of a signal having a fundamental frequency, the first component being adapted to substantially attenuate frequencies outside of a first narrow range of frequencies encompassing the fundamental frequency and deliver a first filtered signal; and a second component coupled to the source of the signal, the second component being adapted to substantially attenuate frequencies outside of a second narrow range of frequencies encompassing an odd harmonic component of the fundamental frequency and deliver a second filtered signal, wherein the first and second components are coupled to form a periodic signal from the first and second filtered signals.

23. A filter, as set forth in claim 22, further comprising a third component coupled to the source of the signal, the third component being adapted to substantially attenuate frequencies outside of a third narrow range of frequencies encompassing another odd harmonic component of the fundamental frequency.

24. A filter, as set forth in claim 22, wherein the first and second components are coupled in parallel.

25. A filter, as set forth in claim 22, further comprising a delay element disposed between the source and the first component.

26. A filter, as set forth in claim 22, further comprising a delay element disposed between the source and the second component.

27. A filter, as set forth in claim 22, further comprising a delay element adapted to receive one of the first and second filtered signals and modify the received signal to alter a phase relationship between the first and second filtered signals.

28. A filter, as set forth in claim 27, wherein the delay element is adapted to reduce a phase differential between the first and second filtered signals.

29. A method, as set forth in claim 27, wherein the delay element is adapted to substantially synchronize the first and second filtered signals.

30. A filter, comprising:

a first component coupled to a source of a signal having a fundamental frequency, the first component being adapted to substantially attenuate frequencies outside of a first narrow range of frequencies encompassing the fundamental frequency and deliver a first filtered signal; and a second component coupled to the source of the signal, the second component being adapted to substantially attenuate frequencies outside of a second narrow range of frequencies encompassing an odd harmonic component of the fundamental frequency and deliver a second filtered signal, wherein the first component is a first crystal and the second component is a second crystal.

* * * * *